(12) United States Patent
Damiano et al.

(10) Patent No.: US 9,275,825 B2
(45) Date of Patent: Mar. 1, 2016

(54) SAMPLE HOLDER FOR ELECTRON MICROSCOPY FOR LOW-CURRENT, LOW-NOISE ANALYSIS

(71) Applicants: John Damiano, Apex, NC (US); David P. Nackashi, Raleigh, NC (US); Daniel S. Gardiner, Wake Forest, NC (US)

(72) Inventors: John Damiano, Apex, NC (US); David P. Nackashi, Raleigh, NC (US); Daniel S. Gardiner, Wake Forest, NC (US)

(73) Assignee: PROTOCHIPS, INC., Morrisville, NC (US)

( * ) Notice: Subject to any disclaimer, the term of this patent is extended or adjusted under 35 U.S.C. 154(b) by 0 days.

(21) Appl. No.: 14/369,537

(22) PCT Filed: Dec. 28, 2012

(86) PCT No.: PCT/US2012/072050
§ 371 (c)(1),
(2) Date: Jun. 27, 2014

(87) PCT Pub. No.: WO2013/102064
PCT Pub. Date: Jul. 4, 2013

(65) Prior Publication Data
US 2014/0361194 A1 Dec. 11, 2014

Related U.S. Application Data

(60) Provisional application No. 61/581,804, filed on Dec. 30, 2011.

(51) Int. Cl.
H01J 37/00 (2006.01)
H01J 37/20 (2006.01)
H01J 37/28 (2006.01)
H01J 37/26 (2006.01)

(52) U.S. Cl.
CPC ............. *H01J 37/20* (2013.01); *H01J 37/261* (2013.01); *H01J 37/28* (2013.01); *H01J 2237/2002* (2013.01); *H01J 2237/2802* (2013.01)

(58) Field of Classification Search
CPC ...................... H01J 37/20; H01J 2237/2007
USPC ........ 250/306, 307, 310, 311, 441.11, 442.11
See application file for complete search history.

(56) References Cited

U.S. PATENT DOCUMENTS

| | | | |
|---|---|---|---|
| 7,713,053 | B2 | 5/2010 | Mick et al. |
| 8,466,432 | B2 | 6/2013 | Damiano, Jr. et al. |
| 8,513,621 | B2 | 8/2013 | Nackashi et al. |
| 8,829,469 | B2 | 9/2014 | Damiano, Jr. et al. |
| 8,872,129 | B2 | 10/2014 | Damiano, Jr. et al. |
| 2002/0008201 | A1* | 1/2002 | Tanaka et al. ............. 250/310 |
| 2004/0061066 | A1 | 4/2004 | Harada et al. |
| 2010/0090109 | A1 | 4/2010 | Hatano et al. |
| 2010/0140497 | A1 | 6/2010 | Damiano, Jr. et al. |
| 2010/0143198 | A1 | 6/2010 | Damiano, Jr. et al. |

(Continued)

FOREIGN PATENT DOCUMENTS

WO 2010112242 A1 10/2010

OTHER PUBLICATIONS

International Search Report, Apr. 29, 2013.

*Primary Examiner* — Michael Maskell
(74) *Attorney, Agent, or Firm* — Tristan A. Fuierer; Moore & Van Allen, PLLC

(57) ABSTRACT

A novel specimen holder for insertion in electron microscopes, wherein the novel specimen holder is designed to minimize electrical noise so that signal integrity can be maintained during in situ electron microscopy.

8 Claims, 2 Drawing Sheets

(56) References Cited

U.S. PATENT DOCUMENTS

2010/0320396 A1* 12/2010 Terada et al. ............ 250/441.11
2011/0032611 A1 2/2011 Mick et al.
2011/0127427 A1* 6/2011 Nackashi et al. ............ 250/307
2011/0248165 A1* 10/2011 Damiano et al. ............ 250/307
2012/0018821 A1 1/2012 Beyeler
2012/0292505 A1 11/2012 Damiano et al.

* cited by examiner

SAMPLE HOLDER FOR ELECTRON MICROSCOPY FOR LOW-CURRENT, LOW-NOISE ANALYSIS

CROSS REFERENCE TO RELATED APPLICATIONS

This application is filed under the provisions of 35 U.S.C. §371 and claims the priority of International Patent Application No. PCT/US2012/072050 filed on Dec. 28, 2012 entitled "SAMPLE HOLDER FOR ELECTRON MICROSCOPY FOR LOW-CURRENT, LOW-NOISE ANALYSIS" in the name of John Damiano et al., which claims priority to U.S. Provisional Patent Application No. 61/581,804 filed Dec. 30, 2011, all of which are incorporated herein by reference in their entireties.

FIELD

The invention relates generally to specimen holders used for mounting samples in an electron microscope, e.g., a transmission electron microscope (TEM), a scanning transmission electron microscopy (STEM) and variations of the scanning electron microscopes (SEM) that use traditional TEM-type holders and stages, for low-current and low-noise imaging and analysis.

BACKGROUND

The specimen holder is a component of an electron microscope providing the physical support for specimens under observation. Specimen holders traditionally used for TEMs and STEMs, as well as some modern SEMs, consist of a rod that is comprised of three key regions: the end (300), the barrel (200) and the specimen tip (100) (see, e.g., FIG. 1). In addition to supporting the specimen, the specimen holder provides an interface between the inside of the instrument (i.e., a vacuum environment) and the outside world.

To use the specimen holder, one or more samples are first placed on a specimen support device. The specimen support device is then mechanically fixed in place at the specimen tip, and the specimen holder is inserted into the electron microscope through a load-lock. During insertion, the specimen holder is pushed into the electron microscope until it stops, which results in the specimen tip of the specimen holder being located in the column of the microscope. At this point, the barrel of the specimen holder bridges the space between the inside of the microscope and the outside of the load lock, and the end of the specimen holder is outside the microscope. To maintain an ultra-high vacuum environment inside the electron microscope, flexible o-rings are typically found along the barrel of the specimen holder, and these o-rings seal against the microscope when the specimen holder is inserted. The exact shape and size of the specimen holder varies with the type and manufacturer of the electron microscope, but each holder contains these three key regions.

The specimen holder can also be used to provide stimulus to the specimen, and this stimulus can include temperature (heating or cooling), electrical (e.g., applying a voltage or current), mechanical (e.g., applying stress or strain), chemical (e.g., containing a sample in a specific chemical environment), gas (e.g. containing a sample in a specific gaseous environment) or several at once. For example, an electrical power supply can generate a current or voltage waveform, while a syringe pump can be used hold and force liquids. This equipment is outside of the microscope, and various connectors are used to bring this stimulus to the holder, down the length of the holder, and to the samples. For example, microfluidic tubing can be used to supply liquids from the syringe pump to the sample, while electrical wires can be used to supply voltage/current. The specimen holder can also be used to deliver electrical signals measured from a sensor near the sample or the sample itself (e.g., electrical currents and/or voltages).

It is an object of the present invention to introduce an electron microscopy holder especially designed for in situ electrical stimuli and/or measurements, wherein said holder is improved to minimize electrical noise so that signal integrity can be maintained.

SUMMARY

The present invention relates generally to a novel specimen holder which minimizes electrical noise so that signal integrity can be maintained, especially when small signals are provided to a sample or measured from a sample.

Other aspects, features and embodiments of the invention will be more fully apparent from the ensuing disclosure and appended claims.

DETAILED DESCRIPTION

Figure 1:
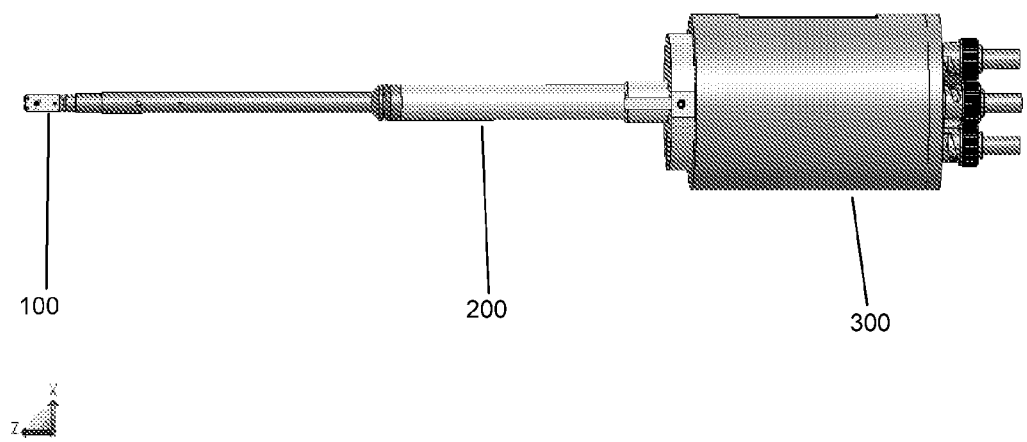
FIG. 1 shows a schematic of a generic specimen holder. The specimen holder is comprised of three regions: the tip (100), the barrel (200), and the end (300).

The present invention generally relates to novel electron microscopy specimen holders, especially for use during in situ electron microscopy where an electrical stimulus is applied. It is to be understood that the specimen holder described herein is compatible with and may be interfaced with the specimen support devices, e.g., semiconductor specimen support devices, disclosed in International Patent Application Nos. PCT/US08/63200 filed on May 9, 2008 and PCT/US08/88052 filed on Dec. 22, 2008, which are both incorporated herein by reference in their entireties. For example, the semiconductor specimen support devices can be membrane based MEMS devices. Further, it is understood that the specimen holder described herein may include the novel specimen holder tips disclosed in U.S. patent application Ser. No. 13/085,273 filed on Apr. 12, 2011 and PCT/US11/46282 filed on Aug. 2, 2011, which are also incorporated herein by reference in their entireties. The specimen holder can be manufactured with tips, barrels and ends of various shapes and sizes such that the specimen holder fits any manufacturer's electron microscope.

The general area of "in situ" electron microscopy involves applying stimulus to a sample during imaging. The stimulus could be thermal (heating or cooling), electrical (applying a voltage or current), mechanical (applying stress or strain), chemical (containing a sample in a specific chemical environment), or several of these at once.

Samples are introduced into the microscope using a "holder." The holder places the sample into the microscope at the correct position for imaging. For in situ electron microscopy, the holder is also used to provide an interface between the sample and equipment located outside the microscope that is used to provide the stimulus. For example, an electrical power supply can generate a current or voltage waveform. This equipment is outside of the microscope, and various connectors are used to bring this stimulus to the holder, down the length of the holder, and to the samples. For example, electrical wires can be used to supply voltage/current.

When samples require very small electrical signals for either stimuli or measurement, for example millivolt (or lower) voltages and/or nanoamp (or lower) currents, small signals have to be provided to the sample and the response measured. Disadvantageously, noise can present due to electromagnetic interference from other conductors in the holder or from sources external to the holder, e.g., other equipment in the microscopy laboratory. Noise can also be coupled into the conductors from power sources near the holder. That said, electrical noise should be minimized so that signal integrity can be maintained so that the electrical response is measurable.

In one aspect, an apparatus for minimizing electrical noise at an electron microscopy holder is described, said apparatus comprising an electron microscopy specimen tip and at least one of a low-noise power supply, at least one shielded cable, at least one triaxial/coaxial connector, an amplifier/pre-amplifier, an A/D and/or D/A converter, or any combination thereof.

With regards to the low-noise power supply, power supplies are available with different minimum voltage/current specifications. For low current/low noise measurements, the lowest possible ratings for these parameters should be chosen when selecting a power supply. For example, a current rating below about 1 µA is preferred.

With regards to the shielded cabling, cables that typically run from the power supply to the connectors on the holder handle, down the length of the holder rod, to the specimen tip, can be shielded, e.g., a coaxial or triaxial cable that has a center conductor and a layer (or layers) of shielding surrounding the center conductor. As described above, shielded cables protect the signal lines from electrical noise. A shielded cable can either reflect the noise or conduct it to ground, depending on how the shield is connected. Cables are typically shielded with metal foil or braided metal wires. The metal foils or wires are then covered with an insulating plastic sheath. In a preferred embodiment, one shielded cable would be required for each electrical contact in the holder tip.

With regards to the triaxial/coaxial connectors, preferably high quality triaxial/coaxial connectors are used to connect all electrical cabling. Connectors can include BNC connectors, F connectors, N connectors, and SMA connectors.

With regards to the amplifier/preamplifier, a high-quality amplifier/preamplifier located in the TEM holder handle can amplify the signal to increase its signal-to-noise ratio and make it less susceptible to noise during transmission from the holder prior to measurement. "Low-noise" amplifiers that provide large gains with minimal noise are ideal. For example, the National Instruments LMC6001 Ultra-low input current amplifier (or similar products) can be used.

With regards to analog-to-digital (A/D) and/or digital-to-analog (D/A) converters, A/D converters can be used to digitize the output signal from the sample and make it less susceptible to noise during transmission from the holder. These converters can also be located in the TEM holder handle. For example, the Texas Instruments DDC 112 Dual Current Input 20-bit A/D Converter can be used. For very small signals, an amplifier (described above) can be used to amplify the signal before it enters the A/D converter. In this case, both the amplifier and the A/D converter can be located in the TEM holder handle.

Figure 2:
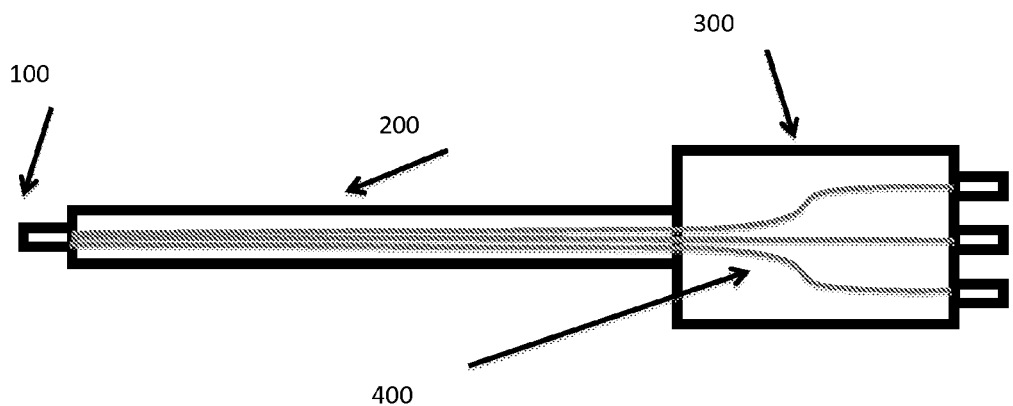
FIG. 2 shows an embodiment of the apparatus described herein, wherein the apparatus comprises shielded cables.

In one embodiment, the electron microscopy holder comprises the specimen tip (100), and a set of shielded cables (400), as shown schematically in FIG. 2. The shielded cables carrying electrical signals from the holder handle to the specimen tip minimize noise/interference from other signal lines and/or the outside environment. Preferably, the holder further comprises a low-noise power supply and triaxial/coaxial connectors. Accordingly, in a preferred embodiment, the electron microscopy holder comprises the specimen tip (100), a low-noise power supply, triaxial/coaxial connectors, and a set of shielded cables (400). When in use, the electron microscopy holder accommodates a specimen device, wherein the specimen device is interfaced with the specimen tip. Preferably the specimen device comprises a membrane-based MEMS device.

Figure 3:
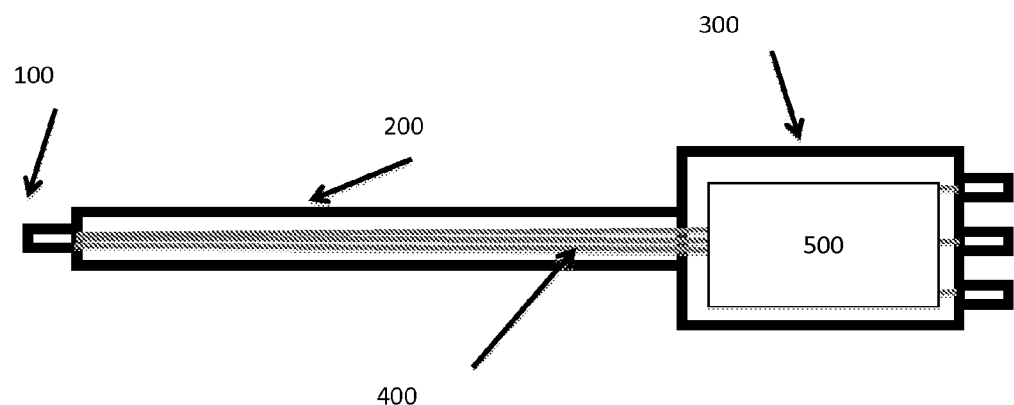
FIG. 3 shows an embodiment of the apparatus described herein, wherein the apparatus comprises shielded cables and an amplifier.

In another embodiment, the electron microscopy holder comprises the specimen tip (100), a set of shielded cables (400) and an amplifier (500) in the holder handle (300), as shown schematically in FIG. 3. The amplifier preferably increases the magnitude of small electrical signals. Preferably, the holder further comprises a low-noise power supply and triaxial/coaxial connectors. Accordingly, in a preferred embodiment, the electron microscopy holder comprises the specimen tip (100), a low-noise power supply, a set of shielded cables (400), triaxial/coaxial connectors, and an amplifier (500) in the holder handle (300). When in use, the electron microscopy holder accommodates a specimen device, wherein the specimen device is interfaced with the specimen tip. Preferably the specimen device comprises a membrane-based MEMS device.

Figure 4:
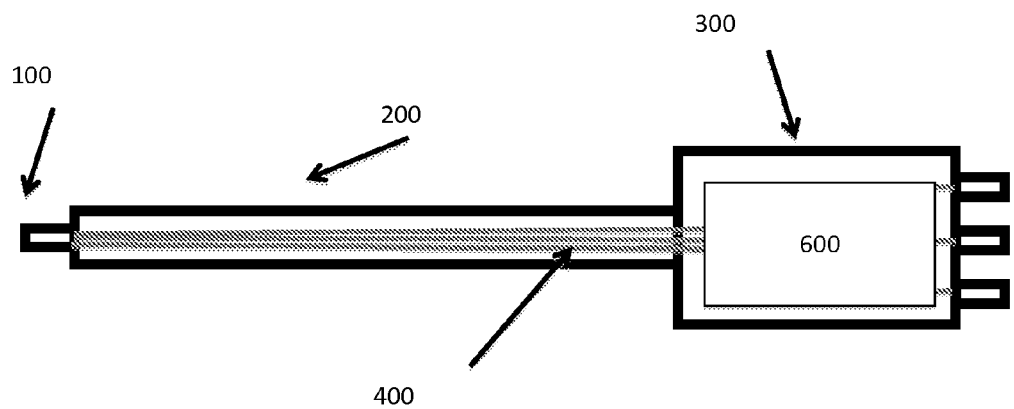
FIG. 4 shows an embodiment of the apparatus described herein, wherein the apparatus comprises shielded cables and a A/D signal converter.

In still another embodiment, the electron microscopy holder comprises the specimen tip (100), a set of shielded cables (400) and an analog-to-digital signal converter (600) in the handle (300), as shown schematically in FIG. 4. The A/D converter preferably provides digital output that can then be transmitted with less susceptibility to noise. Preferably, the holder further comprises a low-noise power supply and triaxial/coaxial connectors. Accordingly, in a preferred embodiment, the electron microscopy holder comprises the specimen tip (100), a low-noise power supply, triaxial/coaxial connectors, a set of shielded cables (400) and an analog-to-digital signal converter (600) in the handle (300). When in use, the electron microscopy holder accommodates a specimen device, wherein the specimen device is interfaced with the specimen tip. Preferably the specimen device comprises a membrane-based MEMS device.

In yet another embodiment, the electron microscopy holder comprises the specimen tip, a set of shielded cables, an amplifier and an analog-to-digital signal converter in the handle. The amplifier preferably increases the magnitude of small electrical signals and the A/D converter preferably provides digital output that can then be transmitted with less susceptibility to noise. Preferably, the holder further comprises a low-noise power supply and triaxial/coaxial connectors. Accordingly, in a preferred embodiment, the electron microscopy holder comprises the specimen tip, a low-noise power supply, triaxial/coaxial connectors, a set of shielded cables, an amplifier and an analog-to-digital signal converter in the handle. When in use, the electron microscopy holder accommodates a specimen device, wherein the specimen device is interfaced with the specimen tip. Preferably the specimen device comprises a membrane-based MEMS device.

It should be appreciated that the electron microscopy holders described herein can be adapted for use in liquid, gas or vacuum environments, as readily understood by the person skilled in the art.

In another aspect, a method of minimizing electrical noise in an electron microscopy holder is described, said method incorporating at least one electrical noise minimizer in said electron microscopy holder, wherein said electrical noise minimizer is selected from the group consisting of a low-noise power supply, at least one shielded cable, at least one triaxial/coaxial connector, an amplifier/pre-amplifier, an A/D and/or D/A converter, and any combination thereof.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. An electron microscope specimen holder comprising a specimen tip, at least one electrical noise minimizer, a holder rod, a holder handle, at least one shielded cable running from the specimen tip down the length of the holder rod to the holder handle, wherein the at least one electrical noise minimizer comprises one of the following combinations,
   (a) a low-noise power supply and at least one triaxial/coaxial connector;
   (b) an amplifier/preamplifier in the holder handle;
   (c) a low-noise power supply, at least one triaxial/coaxial connector, and an amplifier/preamplifier in the holder handle;
   (d) an A/D and/or D/A signal converter in the holder handle;
   (e) a low-noise power supply, at least one triaxial/coaxial connector, and an A/D and/or D/A signal converter in the holder handle;
   (f) an amplifier/preamplifier and an A/D and/or D/A signal converter in the holder handle; or
   (g) a low-noise power supply, at least one triaxial/coaxial connector, and an amplifier/preamplifier and an A/D and/or D/A signal converter in the holder handle.

2. The electron microscope specimen holder of claim 1, comprising combination (a).

3. The electron microscope specimen holder of claim 1, wherein the at least one shielded cable comprises internal wiring extending from an external connector to a region in proximity of the specimen tip.

4. The electron microscope specimen holder of claim 2, further comprising the amplifier/preamplifier, the A/D and/or D/A signal converter, or both the amplifier/preamplifier and the A/D and/or D/A signal converter.

5. The electron microscope specimen holder of claim 1, wherein a specimen device can interface with the specimen tip.

6. A method of minimizing electrical noise in an electron microscopy specimen holder, said method comprising incorporating at least one electrical noise minimizer in said electron microscopy specimen holder, wherein said holder comprises a specimen tip, a holder rod, a holder handle, at least one shielded cable running from the specimen tip down the length of the holder rod to the holder handle, wherein the at least one electrical noise minimizer comprises one of the following combinations,
   (a) a low-noise power supply and at least one triaxial/coaxial connector;
   (b) an amplifier/preamplifier in the holder handle;
   (c) a low-noise power supply, at least one triaxial/coaxial connector, and an amplifier/preamplifier in the holder handle;
   (d) an A/D and/or D/A signal converter in the holder handle;
   (e) a low-noise power supply, at least one triaxial/coaxial connector, and an A/D and/or D/A signal converter in the holder handle;
   (f) an amplifier/preamplifier and an A/D and/or D/A signal converter in the holder handle; or
   (g) a low-noise power supply, at least one triaxial/coaxial connector, and an amplifier/preamplifier and an A/D and/or D/A signal converter in the holder handle.

7. The electron microscope specimen holder of claim 1, wherein a membrane-based MEMS device is interfaced with the specimen tip.

8. The method of claim 6, wherein the holder further comprises a membrane-based MEMS device interfaced with the specimen tip.

* * * * *